(12) United States Patent
Foo

(10) Patent No.: US 6,903,548 B2
(45) Date of Patent: Jun. 7, 2005

(54) METHOD AND APPARATUS FOR MR PERFUSION IMAGE ACQUISITION USING NON-SELECTIVE AND NOTCHED RF SATURATION PULSES

(75) Inventor: Thomas K. F. Foo, Potomac, MD (US)

(73) Assignee: General Electric Company, Milwaukee, WI (US)

( * ) Notice: Subject to any disclaimer, the term of this patent is extended or adjusted under 35 U.S.C. 154(b) by 0 days.

(21) Appl. No.: 10/605,703

(22) Filed: Oct. 21, 2003

(65) Prior Publication Data

US 2005/0083053 A1 Apr. 21, 2005

(51) Int. Cl.$^7$ ................................................. G01V 3/00
(52) U.S. Cl. ...................................... 324/306; 324/307
(58) Field of Search ................................. 324/306, 307, 324/309, 312, 314; 600/410, 413, 419

(56) References Cited

U.S. PATENT DOCUMENTS 6,526,307 B2 * 2/2003 Foo ............................. 600/413
6,618,605 B1 * 9/2003 Wolff et al. .................. 600/410
6,662,037 B2 * 12/2003 Foo ............................. 600/413

OTHER PUBLICATIONS

Elkington, A. et al., Interstudy Reproducibility of Myocardial Perfusion Reserve Using a Novel Dual Acquisition Cardiovascular Magnetic Resonance Sequence, Poster Abstracts: Clinical MRI—Ischemic Heart Disease, Society for Cardiovascular Magnetic Resonance, 2003, #244, p. 107.

Slavin, G. et al., First–Pass Myocardial Perfusion MRI With Interleaved Notched Saturation: Feasibility Study, Radiology 2001, vol. 219, pp. 258–263.

Bertschinger, K. et al., Magnetic Resonance Myocardial First–Pass Perfusion Imaging: Parameter Optimization For Signal Response And Cardiac Coverage, Journal of Magnetic Resonance Imaging, 2001, vol. 14, pp. 556–562.

* cited by examiner

Primary Examiner—Louis Arana
(74) Attorney, Agent, or Firm—Ziolkowski Patent Solutions Group, SC; Michael A. Della Penna; Carl B. Horton

(57) ABSTRACT

A non-selective saturation pulse together with a series of notched RF saturation pulses are used to acquire MR perfusion data. The non-selective saturation recovery RF pulse is non-selective and is designed to be effective at blood pool suppression for a first slice as well as a next slice in a series of slice locations. The first slice. location may be placed at an angle or plane that is not necessarily coaxial with the other slice locations to be imaged. The present invention supports the acquisition of MR data with efficient spatial coverage and a calibration slice of data that provides a linear measure of signal intensity versus contrast concentration in a blood pool.

30 Claims, 3 Drawing Sheets

METHOD AND APPARATUS FOR MR PERFUSION IMAGE ACQUISITION USING NON-SELECTIVE AND NOTCHED RF SATURATION PULSES

BACKGROUND OF INVENTION

The present invention relates generally to magnetic resonance (MR) imaging, and more particularly to, a method and apparatus to acquire MR images with improved image signal and contrast using a non-selective and notched RF saturation pulse in MR perfusion imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Myocardial perfusion imaging includes the detection of a contrast agent as it passes through muscle tissue in the heart to non-invasively study blood flow in the microcirculation of the heart. Typically, perfusion imaging consists of using an injected contrast agent (bolus) with rapid imaging during the first pass of the bolus using carefully optimized pulse sequence parameters. Quantification of blood flow from these images is accomplished with a region-of-interest based signal, time-intensity curve analysis. To avoid cardiac motion artifacts, the perfusion images are typically acquired with ECG gating to synchronize the repeated acquisition of images at different spatial locations, each to the same relative point in the cardiac cycle. In the past, the period of image acquisition was typically several minutes long, causing the images to suffer from significant respiratory motion artifacts. Such artifacts would require the manual registration and analysis of the perfusion images—a cumbersome and time-consuming task because the user must carefully arrange each image to compensate for the respiratory motion before proceeding to a region-of-interest, time-intensity analysis. Furthermore, the passage of the contrast agent takes place over a temporal span of several seconds. By averaging over several seconds or minutes, the effectiveness of measuring any change in perfusion is severely compromised.

The goal of myocardial perfusion imaging is to detect and characterize the abnormal distribution of myocardial blood flow. The ability to extract quantitative perfusion indices such as time-to-peak, contrast enhancement ratio, and the slope from the first-pass contrast-enhanced MR images requires a generation of myocardial and blood-pool time-intensity curves for desired regions-of-interest. The computation of these curves is complicated when patients do not suspend respiration adequately, which then results in an image mis-registration over time. Mis-registration artifacts occur frequently due to the fact that the breath-hold duration required to capture first-pass kinetics is typically 20–30 seconds. An accurate spatial alignment of images over a period of time is necessary for creating representative and accurate time-intensity curves for a given region of the myocardium.

Moreover, quantification of the blood flow or perfusion to cardiac tissue is also an important consideration. For such quantification, it is essential to acquire images at a specific slice location in order to measure the signal intensity as a function of passage of the contrast media (i.e., time). This calibration slice allows the translation of signal intensity into a contrast media concentration. The input function or the amount of contrast introduced into the cardiac tissue can be extracted from this measurement. Thus, by measuring both the input function at a specific slice location and also the signal intensity variation in the cardiac (myocardial) tissue, the blood perfusion to specific regions of the heart can be computed.

The imaging of blood perfusion in tissue is closely related to the imaging of blood flow in vascular structures, such as in MR angiography. As with MR angiography, MR perfusion imaging is performed by injecting the bolus of an MR active contrast agent into the patient during an imaging session. These agents can either decrease the $T_1$ of blood to enhance the detected MR signal, or decrease the $T_2$ of blood to attenuate the detected MR signal. As the bolus passes through the body, the enhanced or attenuated signal increases or decreases the signal intensity observed in perfused tissue, but not in non-perfused tissue. The degree of signal change in the observed tissue can be used to determine the degree of tissue perfusion. Since perfusion measurements are based on the strength of the MR signals acquired during the scan, it is important that the MR signal strength be made insensitive to other measured variables. One such variable is the magnitude of the longitudinal magnetization $M_z$, which is tipped into the transverse plane by the RF excitation pulse in the MR pulse sequence. After each such excitation, the longitudinal magnetization is reduced and then recovers magnitude as a rate determined by the $T_1$ constant of the particular spins being imaged. If another pulse sequence is performed before the longitudinal magnetization has recovered, the magnitude of the acquired MR signal will be less than the signal produced by a pulse sequence which is delayed long enough to allow full recovery of the longitudinal magnetization. It is therefore important in perfusion imaging that the longitudinal magnetization variable be maintained at a constant level throughout the scan. One method to maintain a constant signal intensity level regardless of the preceding time is to use a saturation or 90-degree magnetization preparation that allows the same available longitudinal magnetization for a given post-saturation delay time (TI).

Quantitative analysis of myocardial perfusion requires that adequate spatial coverage be maintained, good signal-to-noise (SNR) ratio be attained so that the myocardial perfusion defects can be qualitatively and quantitatively assessed, and that the measurement of the signal in the blood pool reflects contrast agent concentration. That is, it is desired that the MR signal from the blood pool be linear with the concentration of contrast agent in the blood pool. One particular method of myocardial perfusion data acquisition is characterized by a notched perfusion acquisition. It has been shown that this particular method provides good spatial coverage of the myocardium with high image SNR through longer magnetization recovery time (TI) and the application of a saturation recovery preparation RF pulse. However, in some circumstances, this method has been shown to be inadequate because the notched RF pulse saturates blood outside of the target slice but does not perturb (blood) spins within the target slice. As such, within any one target slice, the blood pool signal in the ventricle or aorta will be a combination of saturated and unsaturated blood. This will hinder an accurate measurement of contrast agent concentration as the signal intensity variation will no longer reflect a linear variation of contrast agent concentration. Notwithstanding the drawbacks of this notched approach, it is preferable over a data acquisition method that does not use notched RF pulses or any slice selective saturation. This is because the signal intensity in the myocardial tissue is unaffected by the inflow effects. Absent notched RF pulses or slice selective saturation, a longer physical TI time must be used thereby increasing combined preparation and readout times. Increasing the preparation and readout times reduces the overall number of slices that may be acquired within a single R—R interval or several R—R intervals thereby negatively affecting patient throughput.

It would therefore be desirable to have a means for acquiring MR perfusion images whereby a notched acquisition may be used for improved image SNR and spatial coverage and yet provide a simultaneous measurement of the blood pool signal which may be analyzed to quantify contrast agent concentration. It would be further desirable to have a pulse sequence that reduces variability in blood pool signal such that a linear measurement of contrast concentration in a blood pool may be obtained.

BRIEF DESCRIPTION OF INVENTION

The present invention relates to a system and method of acquiring MR data using a combination of non-selective preparation and notched RF saturation pulses that provide adequate slice coverage, good overall SNR, and a detectable MR signal that varies linearly with contrast agent concentration for quantitative measurement of myocardial perfusion that overcomes the aforementioned drawbacks.

Rather than exclusively using notched RF saturation pulses, the present invention uses a non-selective saturation pulse together with a series of notched RF saturation pulses to acquire perfusion data of a region-of-interest, e.g. the myocardium. The non-selective saturation recovery RF pulse is non-selective and is designed to be effective for a first slice to be imaged as well as the next slice to be imaged in a series of slices. Since the saturation recovery pulse is non-selective, the first slice may be placed at an angle or along a plane that is not necessarily co-planar or parallel with the other slices imaged. For imaging the myocardium, the non-selective saturation recovery pulse allows a user to prescribe a slice along the pulmonary vein or aortic outflow tract for a better measurement of contrast agent concentration. Further, because the acquisition segment used to acquire data for the first slice has half the spatial resolution of the other imaging segments, overall scan time is not increased.

Therefore, in accordance with one aspect of the present invention, a method of acquiring MR data includes the steps applying a non-selective preparation pulse for a first slice and applying a notched preparation pulse for subsequent slices. The method further includes the step of acquiring MR data for the first and subsequent slices.

In accordance with another aspect of the present invention, a pulse sequence is provided. The pulse sequence includes a non-selective preparation segment followed by a first acquisition segment that are played out in a calibration interval whereas a series of notched selective preparation segments followed by subsequent data acquisition segments are played out thereafter.

According to another aspect of the present invention, an MRI apparatus includes an MRI system having a plurality of gradient coils positioned about a bore of a magnet to impress a polarizing magnetic field and an RF transceiver system, and an RF switch controlled by a pulse module to transmit RF signals to an RF coil assembly to acquire MR images. The MRI apparatus further includes a computer programmed to apply a non-selective, saturation recovery pulse to saturate a first slice of a set of slices. The computer is also programmed to apply a series of notched saturation recovery pulses to saturate each succeeding slice of the set of slices. The computer is further programmed to apply a series of readout excitation pulses and acquire MR data from each slice.

In accordance with yet another aspect of the present invention, a computer readable storage medium has a computer program stored thereon that represents a set of instructions that when executed by a computer causes the computer to generate and cause application of a non-selective preparation segment in a first acquisition period of a series of acquisition periods. The computer is also caused to generate and cause application of a notched preparation segment in subsequent acquisition periods. The set of instructions further causes the computer to generate and cause application of an image acquisition segment in at least the subsequent acquisition periods and acquire MR data in the subsequent acquisition periods.

According to another aspect of the present invention, a computer data signal embodied in a carrier wave and downloadable/uploadable to an MR imaging system is provided. The signal represents at least a pulse sequence to be carried out for MR data acquisition by the MR imaging system. The pulse sequence includes a non-selective preparation pulse to be played out during a calibration interval as well as a notched preparation pulse to be played out in a series of data acquisition intervals following the calibration interval. The pulse sequence further includes a series of imaging pulses to be played out in the calibration and data acquisition intervals for data acquisition in the calibration and data acquisition intervals.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
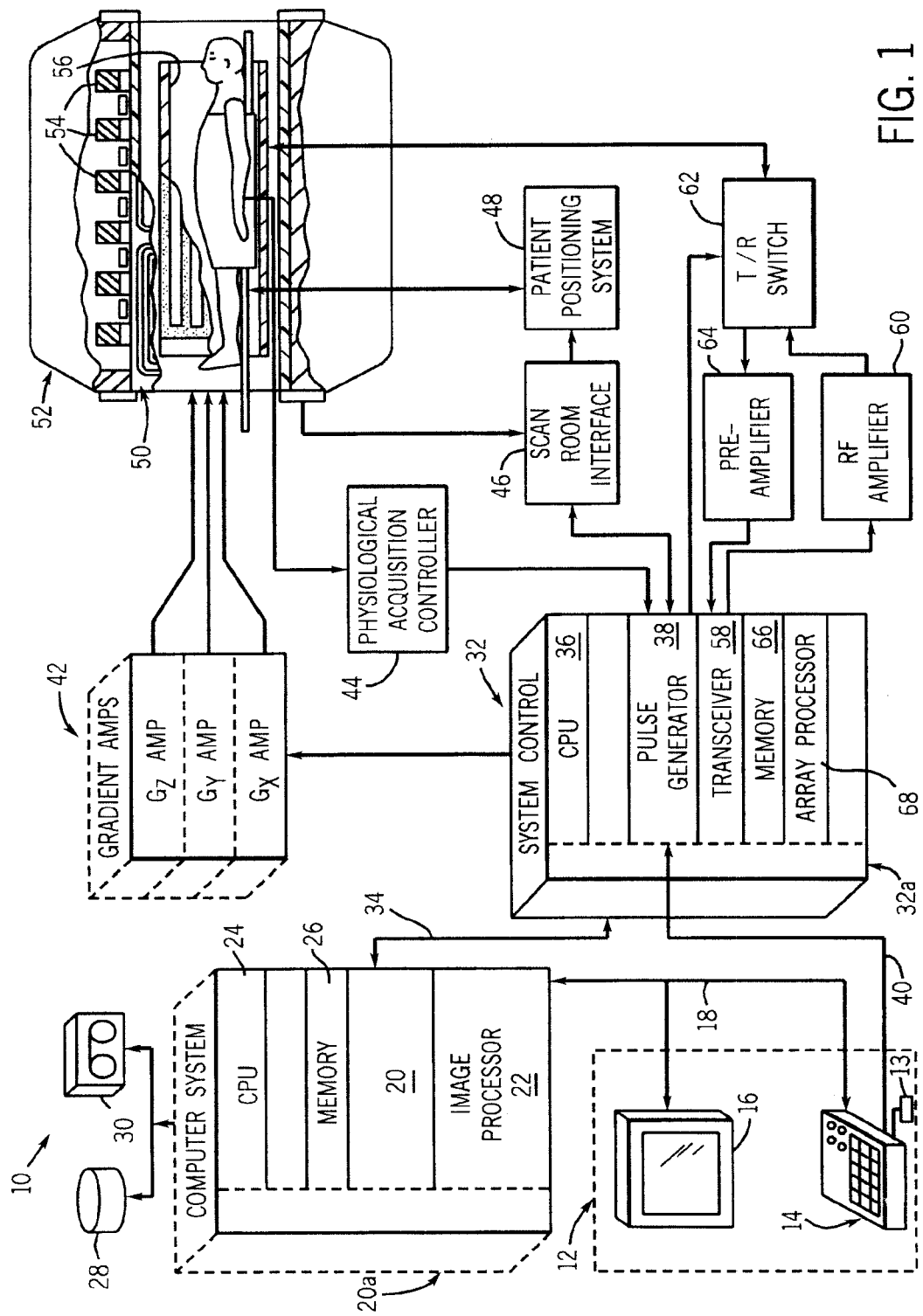
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention includes a method and system suitable for use with the above-referenced NMR system, or any similar or equivalent system for obtaining MR data. The present invention will be described with respect to imaging the myocardium but may be equivalently used to image other anatomical regions or volumes-of-interest.

Figure 2:
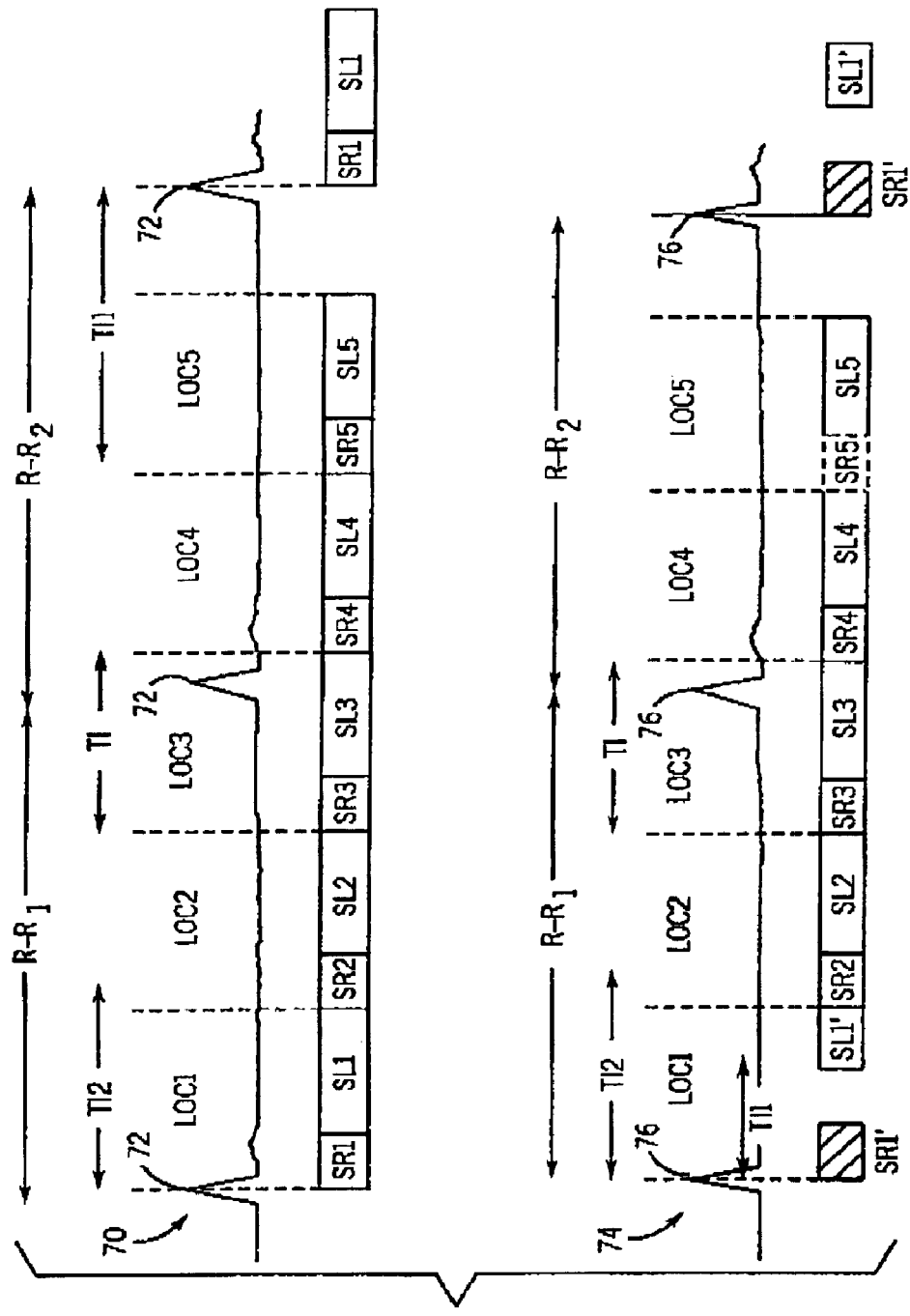
FIG. 2 is a graphical illustration comparing a conventional pulse sequence for myocardial perfusion MR data acquisition with a pulse sequence in accordance with one embodiment of the present invention.

Referring now to FIG. 2, a conventional pulse/acquisition sequence for a myocardial perfusion MR data acquisition and a pulse/acquisition sequence according to the present invention are shown. Sequence 70 illustrates a conventional notched approach to myocardial perfusion MR data acquisition. Pulse sequence 70, in the illustrated example, is designed to be repeated every other R—R interval or heartbeat. ECG signals 72 define or gate each R—R interval. It should be noted that pulse sequenced 70 can also be repeated every heartbeat or every n heartbeats, where n is some number greater than or equal to 1. As indicated, in interval R–R$_1$, data is acquired for three slices (loc1, loc2, loc3) whereas two slices (loc4, loc5) are imaged during the next R—R interval, R–R$_2$. Each slice is imaged during a data acquisition interval and as such the pulse sequence includes a series of data acquisition intervals that are defined by the R—R intervals. In general, the number of possible slices or slice locations that can be acquired can be defined as the number of SR and SL segments that can fit into n R—R intervals, where n=1, 2, 3, . . . It should be noted that if there is a physical delay, PD, then the time for one slice is now (SR+SL+PD), increasing the time per slice and decreasing the maximum number of slices per time point. While the invention will be described with respect to PD=0, one skilled in the art will readily appreciate that the present invention is equivalently applicable with over PD values. As will be described, pulse sequence 70 is characterized by a notched preparation segment as well as an image acquisition segment for data acquisition.

Conventional notched perfusion sequence 70 allows a saturation recovery RF pulse to be effective everywhere except for the immediate slice to be imaged. As illustrated, preparation segment SR1 is effective over each slice except for slice loc1. The spins in the next slice, loc2, will experience the effect of SR1 with an actual recovery time (TI) equivalent to the time needed to play out notched preparation segment SR1 and an image acquisition segment SL1. Image acquisition segments SL1, SL2, SL3, SL4, and SL5 correspond to image acquisition segments defined by a series of imaging excitations that are used to acquire MR data from a respective slice or spatial location.

Similar to notched preparation segment SR1, notched preparation segment SR2 is effective for every slice except slice loc2. As such, notched preparation segment SR2 prepares the magnetization for readout at a later TI time at image acquisition segment SL3. It therefore follows that for conventional pulse sequence 70, the TI time for slice loc1 is the result of SRn, i.e. the last preparation segment from the previous R—R interval. Accordingly, in the illustrated example, the TI time for SL1 is a function of notched preparation segment SR5 played out in interval R–R$_2$. Further, due to variations in heart rate, this TI time may not be equal to that of the other slices.

As is well known, the effect of the notched preparation pulses (SRn) on blood pool signal is variable depending on blood flow. This variability is a result of unsaturated blood from the notched pulse flowing into an imaged slice and mixing with saturated blood. As a result, the blood pool signal is indeterminate and somewhat independent of contrast agent concentration.

In contrast, pulse sequence 74 is designed to acquire data with efficient spatial coverage but allow for the acquisition of a measurement slice that provides a linear measure of signal intensity versus contrast concentration in the blood pool. Similar to conventional pulse sequence 70, pulse sequence 74 is carried out over a series of R—R intervals or heartbeats as defined by gated signals 76. As such, pulse sequence 74 defines a series of data acquisition intervals. As will be described, the series of data acquisition intervals follows a calibration interval. Further, to accentuate the distinctions between the pulse sequence of the present invention with the conventional pulse sequence, pulse sequence 74 will be described with respect to data acquisition of five slices (loc1, loc2, loc3, loc4, loc5) similar to that which was described with respect to pulse sequence 70.

In contrast to pulse sequence 70, pulse sequence 74 includes a non-selective RF pulse SR1' that is played out at the beginning of interval R–R$_1$, i.e. in the calibration window. Saturation recovery pulse SR1' is non-selective and is effective for the slice loc1 as well as the next slice, loc2. The image acquisition segment SL1' for the first slice or spatial location has, in the illustrated example, one-half the spatial resolution of the other image acquisition segments SL2, SL3, SL4, and SL5 that are played out in the data acquisition intervals subsequent to the calibration interval. The TI time for the next slice loc2 is not perturbed as the same segment time (SR1+SL1) of the conventional pulse sequence is maintained, except that the acquisition time for slice loc1 is one-half of that for the conventional pulse sequence 70. That is, SL1' equals (SL1)/2. The TI time for slice loc1 is therefore TI1=(SL1)/2. Hence, the overall segment time is maintained as SR1+SL1=SR1' +TI1+SL1'.

The acquisition of the first slice, loc1, in the series may be of reduced spatial resolution relative to that which is typically required for measurement of signal only in the aorta or in the primary pulmonary vasculature. For example, if the primary image acquisition is a 128×128 matrix acquisition, the first slice can be either a 128×64 or other spatial resolution that permits visualization of the large vascular structures. It should be noted that the sensitivity of the calibration or first slice may be adjusted as the inversion time TI1 is inversely proportional to the resolution. That is, a 128×32 image for slice loc1 will require a longer TI1 than a 128×64 acquisition to maintain overall segment time. It is also possible to dispense with the last preparation segment (SR5 in the illustrated example) as it is no longer required for imaging of first slice, loc1. However, to maintain the spins in slice loc1 in the steady state, it may be desirable to maintain this preparation segment.

Figure 3:
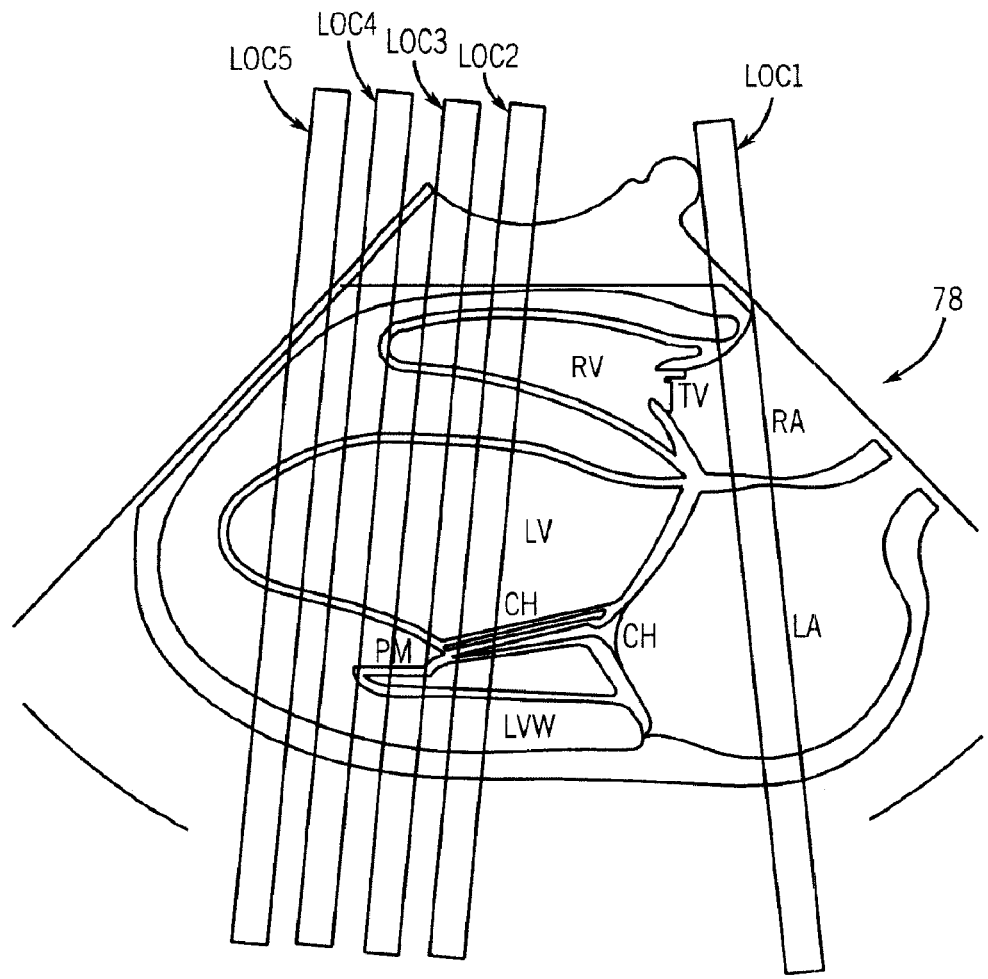
FIG. 3 illustrates slice orientation according to one embodiment of the present invention relative to a cardiac volume being imaged for measurement of myocardial perfusion.

Referring now to FIG. 3, five slice locations which are imaged through application of pulse sequence 74 of FIG. 2 are shown relative to one another and superimposed on a region-of-interest which in the illustrated example corresponds to a patient"s heart. As indicated, slices loc2–5 are commonly oriented, i.e. generally aligned in parallel with respect to one another. However, since the non-selective preparation segment SR1' is non-selective, slice loc1 may be placed at an angle or plane that is not necessarily aligned or co-planar with the other imaged slices. For data acquisition of the myocardium, the non-selectivity of the saturation recovery pulse SR1' allows the user to prescribe data acquisition for a slice along the pulmonary vein or aortic outflow tract for a better measurement of contrast agent concentration. One skilled in the art will recognize that slice loc1 placement relative to the patient's heart effectively causes a loss of data acquisition for a slice in the left ventricle. However, since the TI for this first slice is variable, repositioning of slice loc1 in accordance with application of pulse sequence 74 makes better use of the first slice relative to the slices acquired with a conventional pulse sequence for acquisition of myocardial perfusion data.

The present invention allows for acquisition of high SNR images to qualitatively assess perfusion. In this regard, the present invention provides a pulse sequence and imaging technique that supports data acquisition with efficient spatial coverage as well as acquisition of a calibration slice that provides a linear measure of signal intensity versus contrast concentration in the blood pool. That is, the present invention allows for simultaneous measurement of blood pool contrast concentration for quantitative analysis of perfusion data without the perturbing the acquisition of contrast characteristics of subsequent slices. Moreover, sufficient spatial coverage is achievable while allowing for acquisition of a calibration slice that does not require either a low contrast dose or a dual contrast bolus (low dose followed by high dose), or the use of general non-selective saturation recovery RF pulses that may negatively affect image contrast, SNR, and spatial coverage. For example, the present invention allows for efficient spatial coverage of the left ventricle as well as data acquisition for a calibration slice that may be quantitatively and qualitatively assessed to measure contrast agent concentration.

Therefore, in accordance with one aspect of the present invention, a method of acquiring MR data includes the steps applying a non-selective preparation pulse for a first slice and applying a notched preparation pulse for subsequent slices. The method further includes the step of acquiring MR data for the first and subsequent slices.

In accordance with another aspect of the present invention, a pulse sequence is provided. The pulse sequence includes a non-selective preparation segment followed by a first acquisition segment that are played out in a calibration interval whereas a series of notched selective preparation segments followed by subsequent data acquisition segments are played out thereafter.

According to another aspect of the present invention, an MRI apparatus includes an MRI system having a plurality of gradient coils positioned about a bore of a magnet to impress a polarizing magnetic field and an RF transceiver system, and an RF switch controlled by a pulse module to transmit RF signals to an RF coil assembly to acquire MR images. The MRI apparatus further includes a computer programmed to apply a non-selective, saturation recovery pulse to saturate a first slice of a set of slices. The computer is also programmed to apply a series of notched saturation recovery pulses to saturate each succeeding slice of the set of slices. The computer is further programmed to apply a series of readout excitation pulses and acquire MR data from each slice.

In accordance with yet another aspect of the present invention, a computer readable storage medium has a computer program stored thereon that represents a set of instructions that when executed by a computer causes the computer to generate and cause application of a non-selective preparation segment in a first acquisition period of a series of acquisition periods. The computer is also caused to generate and cause application of a notched preparation segment in subsequent acquisition periods. The set of instructions further causes the computer to generate and cause application of an image acquisition segment in at least the subsequent acquisition periods and acquire MR data in the subsequent acquisition periods.

According to another aspect of the present invention, a computer data signal embodied in a carrier wave and downloadable/uploadable to an MR imaging system is provided. The signal represents at least a pulse sequence to be carried out for MR data acquisition by the MR imaging system. The pulse sequence includes a non-selective preparation pulse to be played out during a calibration interval as well as a notched preparation pulse to be played out in a series of data acquisition intervals following the calibration interval. The pulse sequence further includes a series of imaging pulses to be played out in the calibration and data acquisition intervals for data acquisition in the calibration and data acquisition intervals.

The present invention has been described in terms of the preferred embodiment, and it is recognized that equivalents, alternatives, and modifications, aside from those expressly stated, are possible and within the scope of the appending claims.

What is claimed is:

1. A method comprising the steps of:
    applying a non-selective preparation pulse for a first slice;
    applying a notched preparation pulse for subsequent slices; and
    acquiring MR data.

2. The method of claim 1 wherein the non-selective preparation pulse is effective for blood pool suppression for the first slice and a next slice.

3. The method of claim 1 wherein the step of acquiring includes the step of applying a series of readout pulses for each slice.

4. The method of claim 3 wherein each series of readout pulses defines an image acquisition segment and wherein the image acquisition segment for the first slice has less spatial resolution than that of the other acquisition segments.

5. The method of claim 3 wherein the first slice acquired has a different orientation than that of subsequent slices acquired.

6. The method of claim 5 wherein the subsequent slices acquired are oriented in parallel to one another.

7. The method of claim 1 wherein the number or slices extend over a series of R—R intervals.

8. The method of claim 1 further comprising the step of providing a linear measurement of contrast concentration over a region-of-interest.

9. The method of claim 1 further comprising the step of reconstructing an image of renal or liver perfusion in a subject.

10. A pulse sequence comprising:
    a non-selective preparation segment followed by a first acquisition segment played out in a calibration interval; and
    a series of notched selective preparation segments followed by subsequent data acquisition segments played out after the calibration interval.

11. The pulse sequence of claim 10 wherein the first acquisition segment has a spatial resolution different from that of the subsequent acquisition segments.

12. The pulse sequence of claim 11 wherein the spatial resolution of the first acquisition segment is less than that of the subsequent acquisition segments.

13. The pulse sequence of claim 12 wherein the spatial resolution of the image acquisition segment is one-half than that of the image acquisition segments.

14. The pulse sequence of claim 10 further comprising a data acquisition segment in a given R—R interval that is not preceded by a non-selective preparation segment for that data acquisition segment.

15. The pulse sequence of claim 10 wherein the non-selective preparation segment includes a saturation recovery pulse that is effective for a first slice and a next slice.

16. The pulse sequence of claim 10 wherein the first acquisition segment is configured to acquire data that extends along a plane different from data acquired in the subsequent data acquisition segments.

17. An MRI apparatus comprising:
    a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
    a computer programmed to:
        apply a non-selective, saturation recovery pulse designed to saturate a first slice of a sit of slices;
        apply a series of notched saturation recovery pulses to saturate each succeeding slice of the set of slices;
        apply a series of readout excitation pulses; and
        acquire MR data from each slice of the set of slices.

18. The MRI apparatus of claim 17 wherein the computer is further programmed to acquire multiple slices of data in a single R—R interval.

19. The MRI apparatus of claim 17 wherein the series of readout excitation pulses represents an image acquisition segment played out for data acquisition from each slice and wherein the image acquisition segment of the first slice has a spatial resolution less than each other image acquisition segment.

20. The MRI apparatus of claim 19 wherein the spatial resolution of the first image acquisition segment is one-half of that of each other image acquisition segment.

21. The MRI apparatus of claim 20 wherein the non-selective, saturation recovery pulse is effective over the first slice and a next slice.

22. The MRI apparatus of claim 20 wherein the series of notched saturation recovery pulses are selective saturation pulses to suppress a blood pool.

23. A computer readable storage medium having a computer program stored thereon and representing a set of instructions that when executed by a computer causes the computer to:
    generate and cause application of a non-selective preparation segment in a first acquisition period of a series of acquisition periods;
    generate and cause application of a notched preparation segment in subsequent acquisition periods;
    generate and cause application of an image acquisition segment in at least the subsequent acquisition periods; and
    acquire MR data in the subsequent acquisition periods.

24. The computer readable storage medium of claim 23 wherein the set of instructions further causes the computer to assess a linearity of contrast concentration in a region-of-interest.

25. The computer readable storage medium of claim 23 wherein the series of acquisition periods extends over at least two R—R intervals.

26. The computer readable storage medium of claim 23 wherein the image acquisition segment of the first acquisition period has a spatial resolution that is one-half of that for each other acquisition segment.

27. The computer readable storage medium of claim 23 wherein the set of instructions further causes the computer to cause application of the non-selective preparation segment to be effective for a first slice and a next slice.

28. The computer readable storage medium of claim 27 wherein the set of instructions causes the computer to acquire MR data for a single slice in each acquisition period.

29. The computer readable storage medium of claim 27 wherein the non-selective preparation segment includes a saturation recovery RF preparation pulse.

30. A computer data signal embodied in a carrier wave and downloadable/uploadable to an MR imaging system, the signal representing at least a pulse sequence to be carried out for MR data acquisition by the MR imaging system, the pulse sequence having:

a non-selective preparation pulse to be played out during a calibration interval;

a notched preparation pulse to be played out in a series of data acquisition intervals following the calibration interval; and a series of imaging pulses to be played out in the calibration and data acquisition intervals for data acquisition in the calibration and data acquisition intervals.

* * * * *

UNITED STATES PATENT AND TRADEMARK OFFICE
CERTIFICATE OF CORRECTION

PATENT NO. : 6,903,548 B2
DATED : June 7, 2005
INVENTOR(S) : Thomas K. F. Foo

It is certified that error appears in the above-identified patent and that said Letters Patent is hereby corrected as shown below:

Column 10,
Line 5, delete "sit" and substitute therefore -- set --.

Signed and Sealed this

Sixteenth Day of August, 2005

JON W. DUDAS
*Director of the United States Patent and Trademark Office*